United States Patent
Rotondaro et al.

(10) Patent No.: US 7,233,035 B2
(45) Date of Patent: Jun. 19, 2007

(54) DUAL WORK FUNCTION GATE ELECTRODES USING DOPED POLYSILICON AND A METAL SILICON GERMANIUM COMPOUND

(75) Inventors: Antonio L. P. Rotondaro, Dallas, TX (US); Mark R. Visokay, Richardson, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/463,128

(22) Filed: Aug. 8, 2006

(65) Prior Publication Data

US 2006/0292790 A1    Dec. 28, 2006

Related U.S. Application Data

(62) Division of application No. 10/301,224, filed on Nov. 21, 2002, now Pat. No. 7,109,077.

(51) Int. Cl.
*H01L 29/80* (2006.01)
*H01L 21/336* (2006.01)

(52) U.S. Cl. .................. 257/274; 257/338; 257/350; 438/199; 438/216

(58) Field of Classification Search ............. 257/19, 257/66, 274, 338, 350, 574, 769; 438/199, 438/216, 590, 592, 655
See application file for complete search history.

(56) References Cited

U.S. PATENT DOCUMENTS

| | | | |
|---|---|---|---|
| 4,974,051 A | 11/1990 | Matloubian et al. |
| 5,027,185 A | 6/1991 | Liauh |
| 5,763,922 A | 6/1998 | Chau |
| 6,020,243 A | 2/2000 | Wallace et al. |
| 6,083,836 A | 7/2000 | Rodder |
| 6,214,679 B1 | 4/2001 | Murthy et al. |
| 6,383,879 B1 | 5/2002 | Kizilyalli et al. |
| 6,600,212 B2 | 7/2003 | Takayanagi et al. |
| 6,709,912 B1 | 3/2004 | Ang et al. |
| 2004/0018681 A1 | 1/2004 | Pham et al. |

*Primary Examiner*—Hsien-Ming Lee
(74) *Attorney, Agent, or Firm*—Peter K. McLarty; W. James Brady, III; Frederick J. Telecky, Jr.

(57) ABSTRACT

A dielectric layer (50) is formed over a semiconductor (10) that contains a first region (20) and a second region (30). A polysilicon layer is formed over the dielectric layer (50) and over the first region (20) and the second region (30). The polysilicon layer can comprise 0 to 50 atomic percent of germanium. A metal layer is formed over the polysilicon layer and one of the regions and reacted with the underlying polysilicon layer to form a metal silicide or a metal germano silicide. The polysilicon and metal silicide or germano silicide regions are etched to form transistor gate regions (60) and (90) respectively. If desired a cladding layer (100) can be formed above the metal gate structures.

4 Claims, 4 Drawing Sheets

DUAL WORK FUNCTION GATE ELECTRODES USING DOPED POLYSILICON AND A METAL SILICON GERMANIUM COMPOUND This application is a divisional of application Ser. No. 10/301,224, filed Nov. 21, 2002 now U.S. Pat No. 7,109,077.

CROSS-REFERENCE TO RELATED PATENT/PATENT APPLICATIONS

The following co-assigned pending patent applications are hereby incorporated by reference:

| Patent No./ Ser. No. | Filing Date | Inventors |
|---|---|---|
| 09/998,068 | Nov. 30, 2001 | Rotondaro et al. |
| 60/334,459 | Nov. 30, 2001 | Rotondaro et al. |
| 10/254,396 | Sep. 25, 2002 | Rotondaro et al. |

FIELD OF THE INVENTION

The present invention relates to a method for forming dual work function gate electrodes using doped polysilicon and a metal silicon germanium compound for CMOS integrated circuits.

BACKGROUND OF THE INVENTION

As the dimensions of metal oxide semiconductor (MOS) transistors continue to shrink materials other than silicon oxide are currently being used to form the transistor gate dielectric layer. For MOS transistors with a gate length of less than 30 nm it is estimated that a silicon oxide thickness of 10-15 angstroms will be required to form the gate dielectric layer. One important limitation in determining the suitability of various materials for use in forming the gate dielectric is the amount of gate leakage current that results. In general the gate leakage current increases as the thickness of the gate dielectric layer decreases. One method for increasing the actual gate dielectric layer thickness without affecting transistor performance is to use materials that possess a higher dielectric constant (i.e., high K dielectric) compared to silicon oxide. It is estimated that for low power transistors that need silicon oxide dielectric layers of less that 15 Angstroms a high K dielectric will be necessary. In addition for high performance devices with a required silicon oxide dielectric layer thickness of 10 Angstroms a high K dielectric will also be required. (see International Technology Roadmap for Semiconductors (SIA, San Jose, Calif.) http//public.itrs.net, 2001) Some of the high K dielectrics current being investigated are $HfO_2$, $ZrO_2$, $Al_2O_3$, silicates, aluminates, HfSiON, HfAlON, and HfON.

MOS transistors formed using high K dielectric layers and polysilicon gate electrodes have exhibited large threshold voltage shifts. The threshold voltage shifts are especially large for PMOS transistors that typically have polysilicon gate electrodes that have been doped p-type. For CMOS integrated circuits to function correctly the threshold voltages of the NMOS and PMOS transistors have to be carefully controlled to be less than the supply voltage. The threshold voltage shifts exhibited using high K dielectric and polysilicon gate electrodes will cause CMOS integrated circuits comprising transistors with these layers to be inoperable. In addition to threshold voltage shifts for high K dielectrics, boron penetration and polysilicon depletion effects are also problems that affect PMOS transistors as the thickness of the dielectric layer is reduced. The method of the instant invention provides a solution to the above-described problems of threshold voltage shift, boron penetration, and polysilicon depletion.

SUMMARY OF INVENTION

The instant invention is a method for forming integrated circuits with NMOS and PMOS transistors using dual work function gate electrodes. In particular the method comprises forming at least two regions in a semiconductor. A high K dielectric layer is formed on the semiconductor over the first region and the second region. A germanium-polysilicon layer is then formed over the dielectric layer wherein the germanium concentration in the germanium-polysilicon layer is between 0 and 50 atomic percent. A metal layer is formed on the germanium-polysilicon layer over the first region of the semiconductor. The metal layer and the underlying germanium-polysilicon layer are reacted to form a germano-silicide layer over the first region of said semiconductor substrate. An optional cladding layer can be formed over the germano-silicide layer and the germanium-polysilicon layer. A gate electrode comprising the germano-silicide layer and the cladding layer is defined over the first region of the semiconductor substrate and a gate electrode comprising the germanium-polysilicon layer and the cladding layer is defined over the second region of the semiconductor substrate. In further embodiments of the instant invention the high K dielectric layer is HfSiON and the metal used to form the silicide is selected from the group consisting of chromium (Cr), cobalt (Co), molybdenum (Mo), platinum (Pt), palladium (Pd), tantalum (Ta), titanium (Ti), tungsten (W), nickel (Ni), iridium (ir), zirconium (Zr), hafnium (Hf), ruthenium (Ru), yttrium (Y) and alloys thereof.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1A:
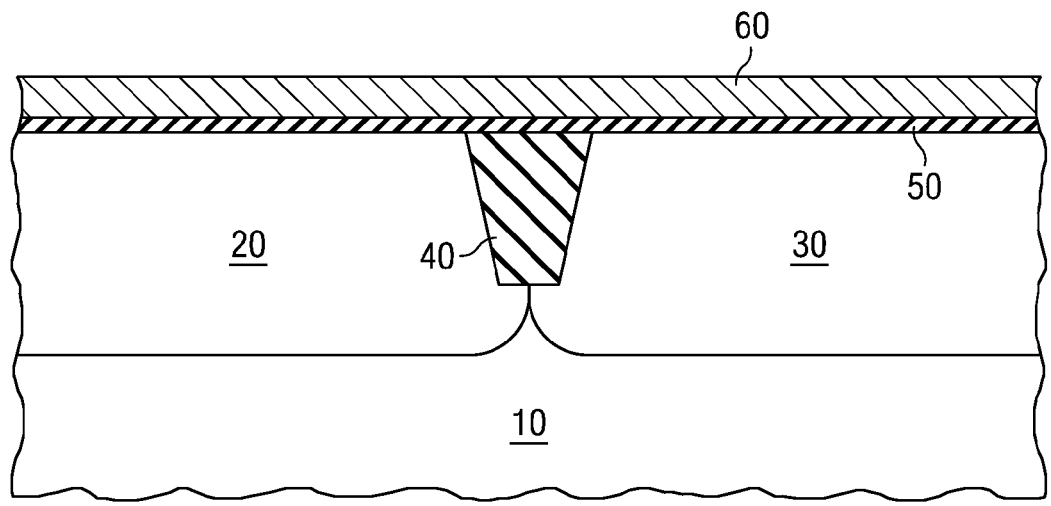
FIGS. 1(a)-(g) are cross-sectional diagrams showing an embodiment of the instant invention.
Figure 1B:
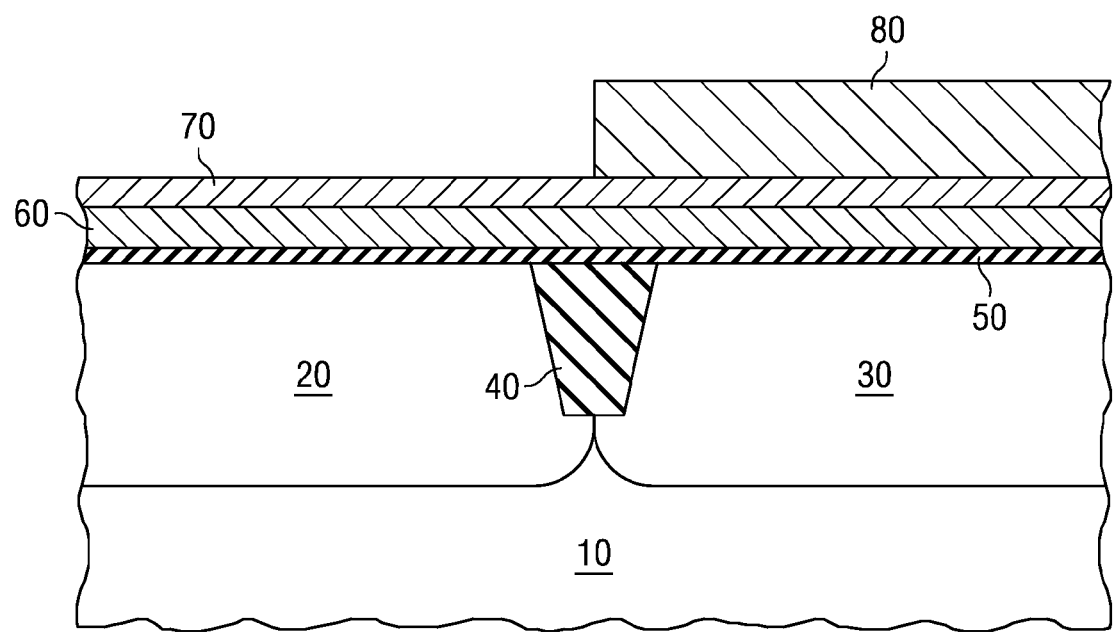

Referring to FIG. 1(a), an n-well region 30 and a p-well region 20 are formed in a semiconductor substrate 10. Implanting p-type dopants into the semiconductor substrate forms the p-well region 20. The p-type implants used to form the p-well region include the well implant, the punch through or channel stop implant, and the threshold voltage implant. These implants are necessary to form the desired doping profile in the p-well region 20. In addition to the above-described implant processes any additional implant processes required to form the p-well region are performed. In a similar manner implanting n-type dopants into the semiconductor substrate forms the n-well region 30. In forming the n-well region 30 the n-type implants include the n-well implant, the channel stop or punch through implant, the threshold voltage implant, as well as any other necessary implant processes required to obtain the desired n-type doping profile. The isolation structure 40 shown in FIG. 1 is typically a shallow trench isolation (STI) structure formed using known processing methodology. A dielectric layer 50 is formed on the surface of the substrate 10 and a silicon-containing layer 60 is formed on the dielectric layer 50. The dielectric layer can be formed using silicon oxide, silicon oxynitride, a stack comprising silicon oxide and silicon nitride, or high K dielectric material. In the instant invention any dielectric material processing a dielectric constant greater than 4.1 can be described as high K dielectric material. The high K dielectric can be $HfO_2$, $ZrO_2$, $Al_2O_3$, silicates, aluminates, HfSiON as well as any other suitable high K dielectric constant material. For the embodiment where a hafnium containing high K dielectric such as HfSiON is used to form layer 50, polycrystalline silicon (polysilicon) containing germanium (polysilicon containing germanium will be referred to as germanium-polysilicon) is used to form layer 60. The germanium concentration can vary from 0 to 50 atomic percent. Following the formation of the germanium-polysilicon layer 60, the region of the layer 60 that will form the gate electrode for the NMOS transistor can be doped n-type by the implantation of n-type dopant species into unmasked regions of the germanium-polysilicon layer 60. The n-type doping of the specified regions of the germanium-polysilicon layer 60 at this point in the process is optional. However doping the germanium-polysilicon layer 60 at this point in the process allows greater control of the final dopant concentration in the germanium-polysilicon layer 60.

Figure 1C:
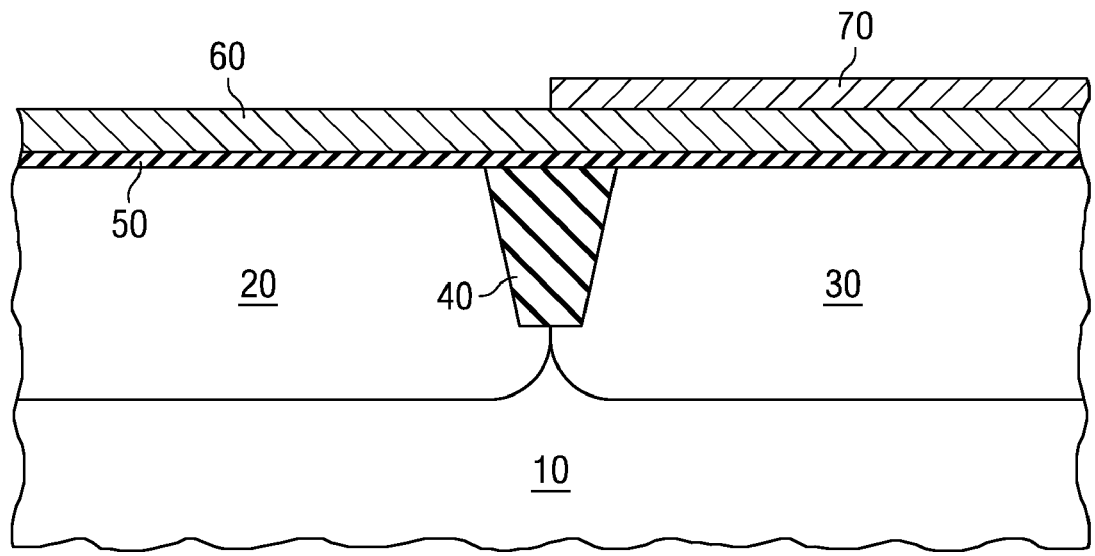

Following the formation of the germanium-polysilicon layer 60, a metal layer 70 is formed on the germanium-polysilicon layer 60 and a patterned photoresist layer 80 is formed to expose a region of the underlying metal layer 70. In a subsequent step the metal layer 70 remaining after the etch process will react with the underlying germanium-polysilicon layer 60 to form a metal germano silicide. As such the metal layer 70 can be formed using any metal that will react with silicon to form a silicide. Some of the metals that can be used to form the metal layer 70 include chromium (Cr), cobalt (Co), molybdenum (Mo), platinum (Pt), palladium (Pd), tantalum (Ta), titanium (Ti), tungsten (W), nickel (Ni), iridium (Ir), zirconium (Zr, hafnium (Hf), ruthenium (Ru), yttrium (Y), and any combination of the above. For purposes of forming the silicide, a capping layer of a different metal can be used. For the embodiment of the instant invention where the silicide will be formed over the PMOS transistor, palladium can be used to form the metal layer 70. Following the formation of the patterned photoresist layer 80, the exposed region of the metal layer is removed using known processing methods with the patterned photoresist layer 80 acting as a mask. Shown in FIG. 1(c) is the structure of FIG. 1(b) following the removal of the exposed region of the metal layer 70 and the patterned photoresist mask 80. An anti-reflective coating (ARC) layer can be used to facilitate the patterning of the metal layer.

Figure 1D:
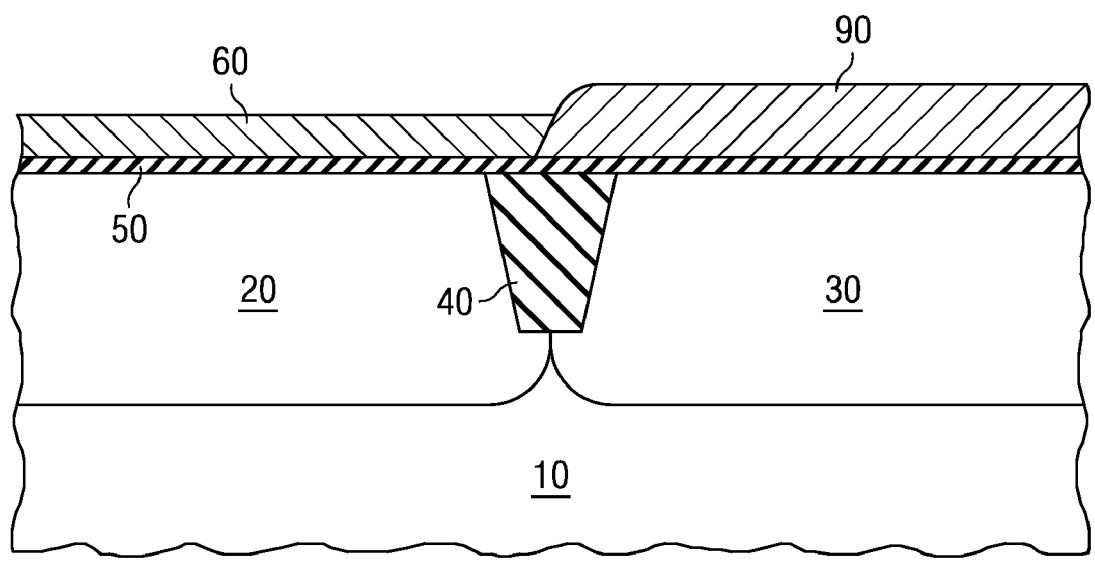

Following the removal of the patterned photoresist layer (mask) 80 the remaining metal layer 70 and the underlying germanium-polysilicon layer 60 are reacted to form the germano-silicide region 90 shown in FIG. 1(d). This reaction is initiated by heating the structure to a specified temperature in a suitable ambient. In the case where palladium was used to form the metal layer 70, a germanium palladium silicide is formed. It should be noted that the germanium concentration in the germanium containing polysilicon layer 60 could be varied from 0 to 50 atomic percent depending on the desired work function of the layer. Therefore the germanium concentration in the formed germano-silicide region 90 will vary depending on the initial germanium concentration in the underlying layer 60. The final work function of the germano-silicide region 90 will depend on the metal used to form the germano-silicide as well as the amount of germanium in the germano-silicide. Adding germanium to the polysilicon layer 60, and therefore to the resulting silicide region 90, results in more flexibility in selecting the final silicide work function. It should be noted that if the polysilicon layer contains no germanium then a silicide would be formed. It should therefore be understood that the use of the term germano-silicide is also meant to include the case when the germanium concentration is zero.

Figure 1E:
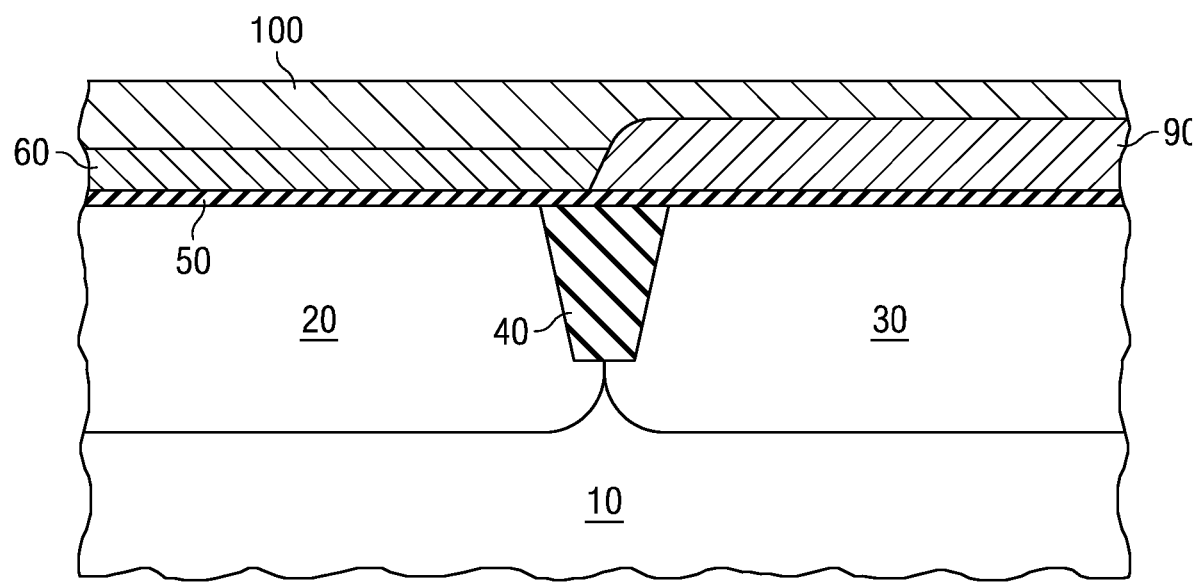

Following the formation of the germano-silicide region any un-reacted metal is removed from the structure. If the remaining germanium-polysilicon layer 60 was not doped n-type previously then at this point the undoped germanium-polysilicon layer 60 can be doped n-type by masking the silicide region 90 and implanting n-type dopants into the unmasked germanium-polysilicon layer 60. In another embodiment of the instant invention both the germanium-polysilicon layer 60 and the silicide region 90 will receive the n-type dopant implants. Following the formation of the germano-silicide region 90 and any doping processes, an optional cladding layer 100 is formed on the structure as shown in FIG. 1(e). The inclusion of the cladding layer 100 may be used for various purposes. For example, if the layers 60 and 90 that will form the gate electrodes of the various transistors are insufficiently thick, a cladding layer 100 may be included to increase the height of the resulting gate electrodes. As another example, if a lower sheet resistance is desired than that achievable without a cladding layer 100, the cladding layer 100 may be included to reduce the sheet resistance. The cladding layer 100 may comprise any suitable material such as a metal. According to one embodiment, the cladding layer 100 comprises a refractory metal such as tungsten, tantalum, titanium, tungsten nitride, tantalum nitride, titanium nitride, and similar materials. In another embodiment of the instant invention the cladding layer is formed using polysilicon. Here the doping of the germanium-polysilicon gate electrode and the cladding layer can be performed during formation of the source and drain regions of the NMOS transistor instead of earlier in the process.

Figure 1F:
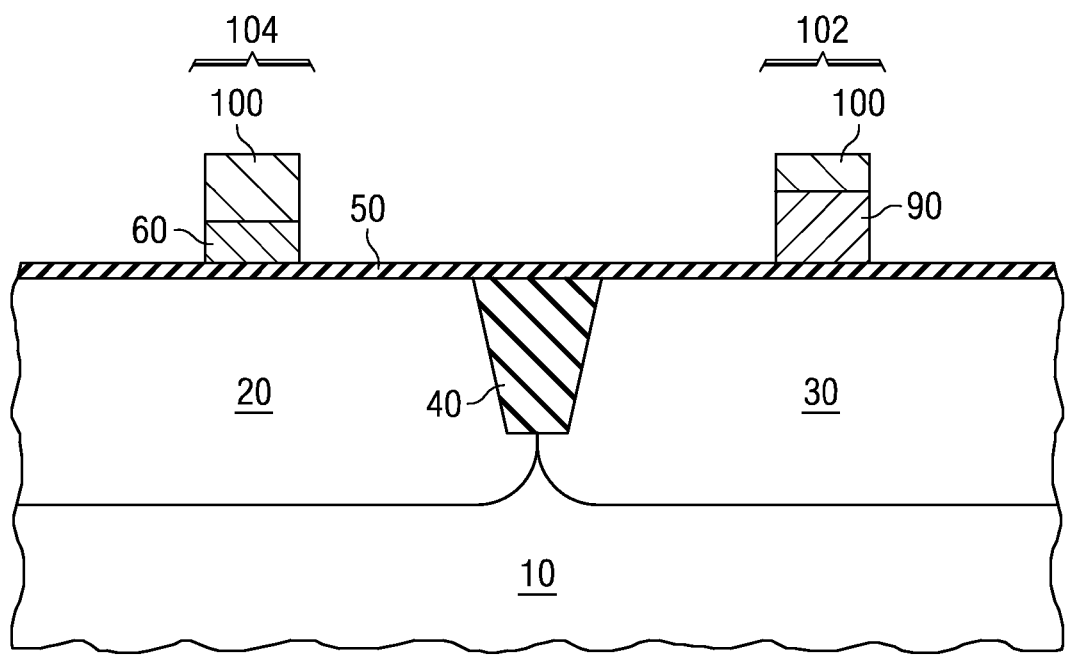

Following the formation of the cladding layer 100, the gate electrode structures for the PMOS transistor 102 and NMOS transistor 104 are formed by patterning and etching the cladding layer 100, the silicide 90, and the germanium containing polysilicon layer 60 as shown in FIG. 1(f). Patterned photoresist can be used as an etch mask during the formation of the gate structures. The PMOS transistor gate electrode 102 comprises the silicide layer 90 and the cladding layer 100. The formation of the PMOS transistor gate electrode 90 using a silicide layer 90 prevents the threshold voltage shifts observed when polysilicon gate electrodes are used. The polysilicon gate electrode 60 of the NMOS transistor provides the desired gate electrode work function for proper NMOS transistor operation.

Figure 1G:
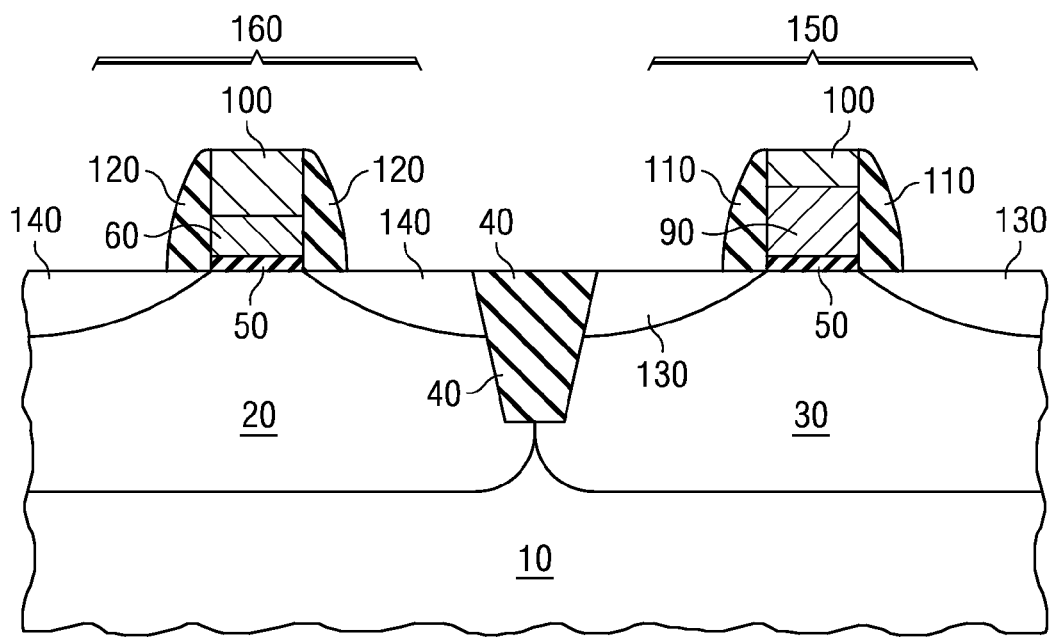

The completed PMOS transistor 150 and NMOS transistor 160 are shown in FIG. 1(g). Following the formation of the gate electrode structures shown in FIG. 1(f), the PMOS transistor 150 is completed by implanting the required dopant species to form the source and drain regions 130 as well as forming the sidewall structures 110. The source and drain regions 130 shown in FIG. 1(g) are meant to include all extension and pocket regions associated with the PMOS transistor 150. Similarly the NMOS transistor 160 is completed by implanting the required dopant species to form the source and drain regions 140 as well as forming the sidewall structures 110. The source and drain regions 140 shown in FIG. 1(g) are meant to include all extension and pocket regions associated with the NMOS transistor 160.

Figure 2:
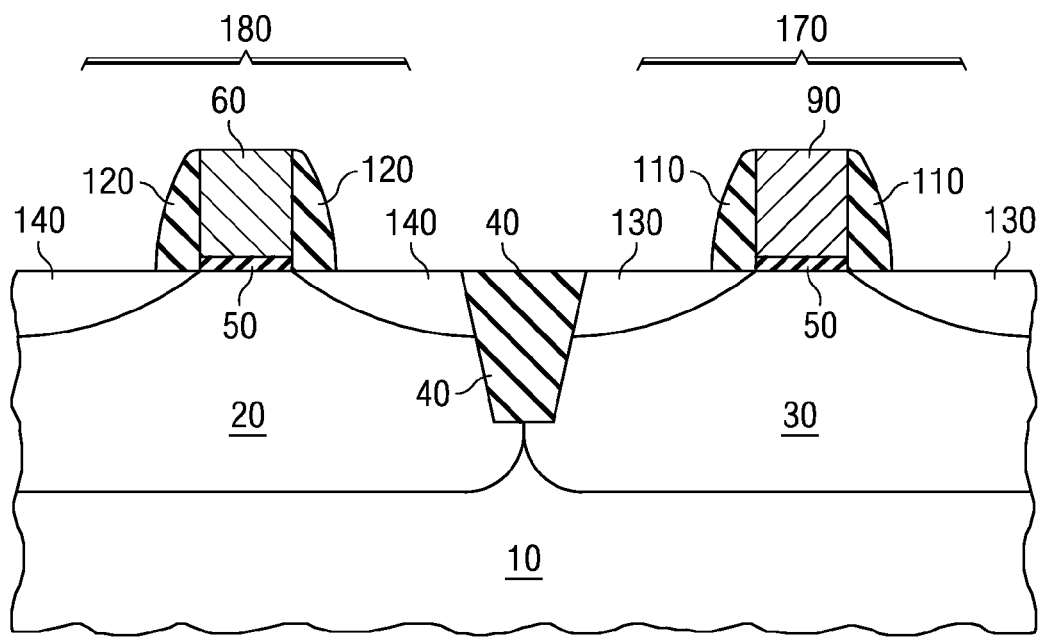
FIG. 2 is a cross-sectional diagram showing a further embodiment of the instant invention.

In a further embodiment of the instant invention shown in FIG. 2, the PMOS transistor 170 and the NMOS transistor 180 are formed without the optional cladding layer. In this embodiment the gate electrode of the PMOS transistor 170 consists of the germano-silicide layer 90 and the gate electrode of the NMOS transistor consists of the germanium containing polysilicon layer 60.

Although the instant invention was described with the gate electrode of the PMOS transistor comprising a germano-silicide layer and the gate electrode of the NMOS transistor comprising the germanium-polysilicon layer other embodiments are encompassed by the instant invention. In a further embodiment the gate electrode of the NMOS transistor comprises a germano-silicide layer and an option cladding layer and the gate electrode of the PMOS transistor comprises a germanium-polysilicon layer and an optional cladding layer. Still further the instant invention was described with the NMOS transistor and the PMOS transistor being formed in p-well regions 20 and n-well regions 30. The instant invention is not however limited to formation of the MOS transistors in n-wells and p-wells. For example the NMOS transistor could be formed in a p-type substrate and the PMOS transistor formed in an n-well region in the p-type substrate or the PMOS transistor could be formed in an n-type substrate and the NMOS transistor could be formed in a p-well region in the n-type substrate. Moreover, silicon on insulator (SOI) substrates could also be used. Thus while this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. An integrated circuit with MOS transistors, comprising:
    a semiconductor substrate comprising first region and a second region;
    a dielectric layer formed outwardly from said semiconductor substrate over said first region and said second region;
    a germano-silicide gate electrode formed on said dielectric layer over said first region of said semiconductor substrate; and
    a germanium-polysilicon gate electrode formed on said dielectric over said second region of said semiconductor substrate.

2. The integrated circuit of claim 1 wherein said first region is n-type and said second region is p-type.

3. The integrated circuit of claim 2 wherein said dielectric layer is HfSiON.

4. The integrated circuit of claim 3 wherein said germano-silicide comprises palladium.

* * * * *